(12) United States Patent
Maguire

(10) Patent No.: US 7,271,374 B2
(45) Date of Patent: Sep. 18, 2007

(54) NON RASTER IMAGE SCANNING

(76) Inventor: James Edward Maguire, 2 Strickland Pl, Wentworthville, NSW (AU) 2145

( * ) Notice: Subject to any disclaimer, the term of this patent is extended or adjusted under 35 U.S.C. 154(b) by 357 days.

(21) Appl. No.: 10/218,225

(22) Filed: Aug. 13, 2002

(65) Prior Publication Data
US 2003/0141435 A1    Jul. 31, 2003

(30) Foreign Application Priority Data
Jan. 25, 2002    (AU) .................................. 13554/02

(51) Int. Cl.
*H01L 27/00*    (2006.01)
(52) U.S. Cl. .................................. 250/208.1; 250/235
(58) Field of Classification Search ............. 250/208.1, 250/235, 216, 559.05, 559.06; 382/277, 382/278, 295, 232, 235, 248, 253; 348/383, 348/384, 571
See application file for complete search history.

(56) References Cited

U.S. PATENT DOCUMENTS 5,295,203 A * 3/1994 Krause et al. ............... 382/248
5,446,806 A * 8/1995 Ran et al. .................... 382/240
5,544,338 A * 8/1996 Forslund ...................... 711/217

* cited by examiner

*Primary Examiner*—Que T Le
(74) *Attorney, Agent, or Firm*—Brown & Michaels, PC

(57) ABSTRACT

A method is described for scanning image pixels in a sequence which, in contrast to the traditional and ubiquitous raster scan, groups effectively adjacent and neighboring image pixels together in the scanned sequence, resulting in a much lower bandwidth signal and data stream, and leading directly to bandwidth and storage gains from compression and exploitation of image redundancy. M-Scan, for meandering scan, is synthesized by iterative application of a simple primitive pattern, and analyzed by iterative partitioning. M-Scans achieve unbroken continuity between pixels in the image, and in routine application never need to step between non image adjacent pixels. Whereas a conventional raster has a low vertical and a high horizontal deflection scan rate, M-Scan has intermediate and equal vertical and horizontal rates, and no large jumps related to flyback. An M-Scan signal power spectrum has no comb at the line rate. M-Scans can be used for 3 dimensional images, or time series 2D images, whilst still preserving adjacent pixel connectivity.

6 Claims, 1 Drawing Sheet

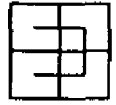
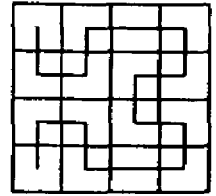

M-Scan primitive sequence (the 2-primitive), and one synthesis thereon

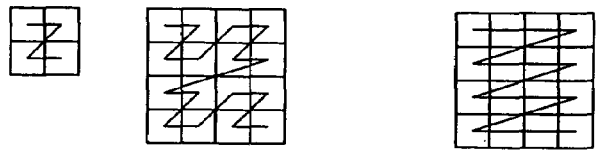

Figure 1: Primitive raster sequence or pattern, its synthesised scan, and 16 pixel conventional raster scan

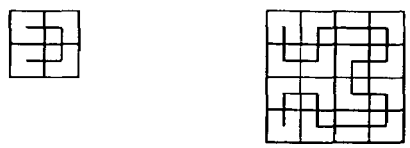

Figure 2: M-Scan primitive sequence (the 2-primitive), and one synthesis thereon

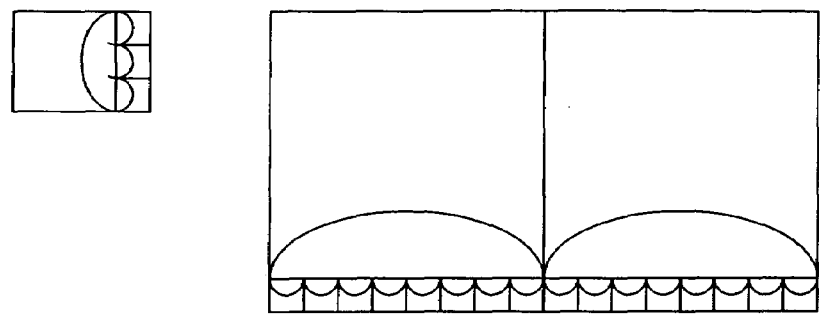

Figure 3: 4:3 and 16:9 aspect ratio images partitioned with connectivity preserved

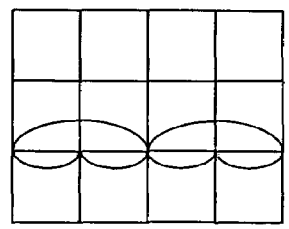

Figure 4: Analysis of an image with 4:3 aspect ratio to use only 2-primitive M-scans

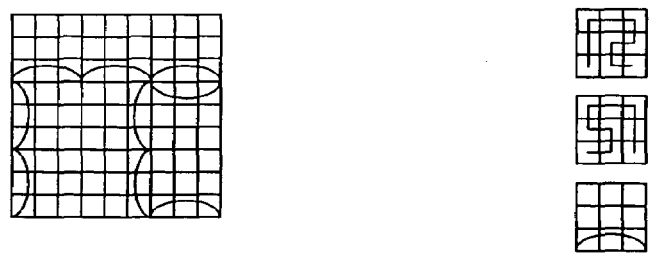

Figure 5: 3-primitive M-scan analysis and synthesis; left relates to upper right

NON RASTER IMAGE SCANNING

CROSS REFERENCE TO RELATED APPLICATIONS

Foreign Priority is claimed through this Information:

| Country | Application Number | Filing Date | Priority Claimed |
|---------|-------------------|-------------|------------------|
| Australia | 13554/02 | Jan. 25, 2002 | Yes |

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not applicable.

BACKGROUND OF THE INVENTION

Images generally consist of pixels, each of a single intensity and color, arranged on a microscopically square grid, building up to a much larger square or rectangular image. Alternative methods, using eg vectors or polygons rather than pixels as the underlying structural element, may be elsewhere referred to as "non raster." In this specification, the term "non raster" refers to a different method of scanning pixels, rather than to non-pixel based graphic representations.

Under the prior art, the large rectangle of pixels has been scanned, or placed in sequence, by simply following straight horizontal lines from left to right across the image, then by retracing (or flyback) to the left again, to the start of the next line underneath the previous one, and so on, to the bottom of the image, then retracing to the top. This is the conventional raster scan. "Deflection" signals, or waveforms, one for horizontal and one for vertical, can define the precise trajectory of the raster scan. At the retraces, these signals become very steep, and the associated video signal, carrying the sequence of scanned pixel values, generally contains discontinuities at the retrace boundaries.

The tendency for discontinuities in the deflection signals at retrace, in the video signal at retrace, and also in the video signal while traversing the image, are either eliminated or much reduced by using M-Scan as specified herein, rather than the conventional raster scan.

BRIEF SUMMARY OF THE INVENTION

This invention defines an improved method of scanning images for digital storage, transmission and processing. The conventional raster scan is replaced with a different scanning method. This scanning method is called M-Scan herein, after meandering, which describes the behaviour of the scan in contrast to the traditional raster.

The points or pixels that make up an image are conventionally scanned in a raster pattern, which has a series of horizontal lines connected by retrace. In raster scanning adjacent image pixels are scanned together (ie consecutively) only if they are horizontally adjacent (or at the joining ends of successive lines). Vertically adjacent pixels are separated by at least a whole line in a conventional raster scan.

In oversampled images with high pixel redundancy, a minimum bandwidth scanning signal, or data stream, can only be produced if adjacent pixels are scanned together as much as possible. A conventional raster scan fails to achieve this well.

This invention describes a method of scanning which does not use a conventional raster, which more effectively groups adjacent pixels in scanning, and which yields a signal or data stream (hereinafter referred to as simply "signal") of much reduced bandwidth than those of the conventional raster, especially for highly redundant or oversampled images. This signal of an M-Scan is much better suited to subsequent transmission through a limited bandwidth channel, and to compressive processing such as run length encoding, than is a raster scan signal. To the extent that the scan lingers in one small region and in doing so mops up large numbers of pixels of the same value, before moving on to the next image region, much higher compression can be achieved by the application of run length encoding.

BRIEF DESCRIPTION OF THE SEVERAL VIEWS OF THE DRAWING

FIG. 1 shows a scan primitive related to a conventional raster scan, a scan using this primitive synthesised in the manner of M-Scan, and a conventional built up raster scan, not synthesised in that way but rather by distorting the primitive.

FIG. 2 shows the M-Scan 2-primitive, which is the principal foundation of M-Scan, and one step in building up a larger image scan using it.

FIG. 3 shows how the popular aspect ratios of 4:3 and 16:9 can be treated at the top level allowing M-Scans to be used at the lower levels.

FIG. 4 shows how a 4:3 image can be scanned using only the 2-primitive and its scans, which isn't true of the method indicated for this in FIG. 3.

FIG. 5 shows the M-Scan 3-primitives, the need for which was implied in the first method of FIG. 3, and one step in building up a larger image scan using them.

DETAILED DESCRIPTION OF THE INVENTION

Recursive partitioning is a principal feature of M-Scan analysis.

The 2-primitive M-Scan for a large square image can be analysed through recursive partitioning. A large square image is first partitioned into four equally sized smaller square images. These four are taken in an order given by a primitive pattern or sequence, and are, in a further iteration, themselves partitioned in the same way. By repeatedly subjecting the outputs of partitioning to further division, the analysis is extended from the full image down to the level of pixels, whose sequence is the full image scan, also known as a Hilbert curve, for this case.

A synthetic approach leading from the pixel level primitive up to the full image M-Scan complements the above analysis. In synthesis, the M-Scan-primitive is rotated and re-applied, but its shape is unaltered.

To first take the conventional raster, the 2-primitive sequence which is a 4 pixel raster scan is shown at the left of FIG. 1.

FIG. 1. Primitive raster sequence or pattern, its synthesised scan, and 16 pixel conventional raster scan To analyse, the 16 pixel image (synthesised scan, centre of FIG. 1) is partitioned into four images of 4 pixels, each of which is scanned according to the primitive sequence on the left. The four are processed in sequence, shown by interconnection, as per the primitive. [A conventional raster scan, shown on the right, does not conform to and is not a solution of this analysis.] To synthesise, four of the primitives are taken, arranged in the same pattern, and interconnected, forming the synthesised 16 pixel scan. A 64 pixel scan could be similarly synthesised by starting with 4 of the 16 pixel scans, and so on leading to a scan of $2^{**}(2n)$ pixels for any desired integer n.

The conventional raster is not built up by iterated synthesis on a constant primitive, but by altering or deforming the raster primitive, as FIG. 1 illustrates.

The principal primitive sequence on which M-Scan is based is a non raster sequence, can be used under recursive partitioning/synthesis to generate a full M-Scan, and is illustrated in FIG. 2.

FIG. 2. M-Scan primitive sequence (the 2-primitive), and one synthesis thereon

To analyse, the image of 16 pixels is partitioned into four images of 4 pixels, each of the four is scanned according to the primitive sequence on the left, but with an internal orientation chosen to achieve connectivity with both the preceding and succeeding partitions. Together with the constraint that scan start and finish remain at opposite ends of the same side, a unique synthesised scan results. By iteration of the synthesis implied in the above analysis, the M-Scans for any square image with $2^{**}(2n)$ pixels can be generated.

The M-Scans achieve a connectivity between partitions which could not be achieved with the raster scan of FIG. 1. This connectivity eliminates from the M-Scans the jumps between non adjacent image pixels and their associated steps or discontinuities in the scan signal, and means that M-Scan signals have a much lower bandwidth than raster scan signals. Ten times narrower bandwidth at the −60 dB points of power spectral density could be achieved, without the additional use of any other compression or bandwidth conservation. The comb-like line structure dominant in the raster scan signal spectrum is absent from the M-Scan signal spectrum. Because of this characteristic, analogue signals carrying M-Scanned images of similar quality could be reasonably packed several times closer together in frequency than their raster scan equivalents. Any sizable image feature is scanned from a diversity of directions with M-Scan, not a strict uniformity as in raster scan.

FIG. 3 shows how images of aspect ratios 4:3 and 16:9 can be readily analysed at the top level into square partitions which can then be further subject to direct M-Scan analysis as described above, whilst enabling continuity between partitions to be retained as before, avoiding scan jumps between nonadjacent image pixels, even at frame endpoints, and minimising scan signal bandwidth. The curves are a shorthand indication, locating the start and end points of scan for that square. The M-scan for a square is uniquely determined by the location of the end points, and the resolution, if only the 2-primitive is used.

FIG. 3. 4:3 and 16:9 aspect ratio images partitioned with connectivity preserved However the top level scan of the 4:3 aspect ratio image of FIG. 3 cannot be performed with subscans based exclusively on the 2-primitive, because one of the squares shown has a side three times longer than another—for the method of FIG. 3 the 3-primitive is needed.

A method of scanning a 4:3 aspect ratio image using only the 2-primitive is shown in FIG. 4. The 4 by 3 image is scanned as two 2by2 squares and four 1 by 1 squares, each of which can be further subdivided with successive 2by2 analysis, obviating the need for the factor 3.

At the right of FIG. 5 the M-scan 3-primitives are shown. These are not unique given the endpoints; there is a choice of 2, and hence during scan synthesis, many implementations are possible due to these choices. One way of choosing the "best" option is to maximise the number of corners.

A scan built on the 3-primitive has fewer corners, is less tight, and does not meander as effectively as a scan using the 2-primitive. The average number of corners per scanned pixel is lower.

Nevertheless, the judicious use of the 3-primitive pattern, preferably at one of the upper levels (ie closer to the whole image) scan or analysis layers, can ease the restriction on available image pixel dimensions, otherwise experienced through exclusive use of the 2-primitive pattern, which restricts dimensions to powers of two.

Higher level primitives can be defined, but the utility and effectiveness is already taken by the 2-primitive possibly augmented with the 3-primitive, and the higher order primitives are hence not expected to be advantageous in most applications.

Three dimensional images can be scanned in one form of this invention through a sequence of 2 dimensional M-Scans, with endpoints joined (ie corresponding to adjacent pixels in the 3D image) thus preserving connectivity and minimising signal bandwidth. In another form of this invention a 3 dimensional M-Scan can be built up in a cube of eight sub cubes, retaining connectivity, with each sub cube containing either a primitive or a sub-scan, in synthesis analogous to the 2D M-Scan synthesis described above. In another form of this invention a time series of 2D images is scanned with a 3D M-Scan as though the series formed a 3D image, thus exploiting the redundancy associated with oversampling in time.

Digital encoding of image information allows adaptive change of parameters such as sampling pitch in all dimensions including time, quantisation resolution, centre value, range from maximum to minimum, and linearity/nonlinearity of quantisation method.

Traditional raster scanning and M-Scanning can be used in a static, data independent mode in which scanning proceeds uniformly; but in another form of this invention M-Scans are used in adaptive or dynamic methods of scanning, where different parameter sets may be used in image partitions, or in partial image processing, to enable image approximations of varying levels of detail, accuracy and bandwidth requirements to be transmitted or processed. In one particular form of this invention, 1 or 2 bit quantisation is performed on an image, which is then M-Scanned, processed, stored in a compact data set and transmitted, and the image is subsequently further processed and improved in selected or priority areas with higher resolution in any or all spatial/time sampling and signal quantisation, again using M-Scanned image data over the target regions desired for further improvement within the image. The crude, coarse, low information density image could for example represent many frames of a uniformly coloured tennis court, or parts of an animation, with the target areas including projectiles and relevant court lines. The rationale behind this approach is to create the best perception of detail and image quality, whilst making more economical use of bandwidth or data storage or transmission capacity or other scarce and limiting resources.

The invention claimed is:

1. A method of sequencing data describing the pixels of a rectangular two or higher dimensional image, into an ordered data stream comprising the steps of:
   a) partitioning an image into a plurality of subimages such that each pixel of the image is contained in one sub-image;
   b) applying a simple primitive scanning sequence to each of the subimages comprising the sub-steps of:
      i) entering each subimage at an entry point,
      ii) exiting each subimage at an exit point such that the exit point is adjacent to the entry point of an adjacent subimage; and
      iii) repeating steps (b)(i) and (b)(ii) until all subimages have been traversed once thereby developing a continuous interconnecting path from a starting point in the image which traverses all of the subimages;
   c) further partitioning each of the subimages into a plurality of sub-subimages;
   d) iteratively repeating steps (b)-(c) until the sub-subimages are individual image pixels;
   e) taking, as the scan path of the image, the fully developed path from step (d) which enters and leaves each image pixel once; and
   f) compiling the ordered data stream by sequencing data describing each image pixel according to the scan path of step (e).

2. The method of claim 1 further comprising the step of:
   g) generating a low bandwidth compact spectrum signal from the data stream of step (f).

3. The method of claim 1, further comprising the step of transforming the data stream of step (f) into a more compact set data set.

4. The method of claim 1 further comprising, between steps (b) and (c), the step of adaptive image scanning wherein the step of adaptive image scanning comprises the sub steps of:
   i) identifying one or more of the subimages for adaptive scanning;
   ii) scanning the identified subimages using at least one of: a different spatial resolution than other subimages; a different scale of quantisation than other subimages;
   wherein the subimages are identified for adaptive processing based on the presence of at least one of: local oversampling; over quantization; low information density; locally high image data redundancy.

5. The method of claim 1 further comprising the step, after step (f) of transmitting the data stream.

6. The method of claim 1 further comprising the step of:
   g) converting the ordered data stream of step (f) into an image on a large screen display having mechanical deflection means for both horizontal and vertical scanning directions comprising the sub steps of:
      i) receiving the data stream;
      ii) extracting from the data stream a vertical deflection component and a horizontal deflection component corresponding to a first pixel's location on the large screen display;
      iii) extracting from the data stream the luminance or the luminance and chrominance data of the first pixel;
      iv) applying the vertical deflection component of sub step (ii) to the vertical deflection means, the horizontal deflection component of sub step (ii) to the horizontal deflection means, and the luminance or luminance and chrominance data of sub step (iii) to beam intensity modulation means;
      v) extracting from the data stream a vertical deflection component and a horizontal deflection component corresponding to the location of the next image pixel after that of sub step (ii) traversed by the scanning path of step (1)(e);
      vi) extracting from the data stream the luminance or the luminance and chrominance data of the image pixel of sub step (v);
      vii) applying the vertical deflection component of step (v) to the vertical deflection means, the horizontal deflection component of step (v) to the horizontal deflection means, and the luminance or luminance and chrominance data of step (vi) to beam intensity modulation means;
      iix) repeating sub steps (v, vi, vii) with each application of step (v) taking the next pixel after that of the preceding application of step (v), until all image pixels sequenced in the data stream have been traversed and displayed.

* * * * *